US012609140B2

(12) United States Patent
Liu et al.

(10) Patent No.: US 12,609,140 B2
(45) Date of Patent: Apr. 21, 2026

(54) SEMICONDUCTOR STRUCTURE AND METHOD FOR FORMING SAME

(71) Applicant: CHANGXIN MEMORY TECHNOLOGIES, INC., Hefei City (CN)

(72) Inventors: Youming Liu, Hefei City (CN); Deyuan Xiao, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 849 days.

(21) Appl. No.: 17/934,189

(22) Filed: Sep. 21, 2022

(65) Prior Publication Data

US 2023/0020883 A1 Jan. 19, 2023

Related U.S. Application Data

(63) Continuation of application No. PCT/CN2022/102861, filed on Jun. 30, 2022.

(30) Foreign Application Priority Data

Apr. 24, 2022 (CN) .......................... 202210433936.8

(51) Int. Cl.
*G11C 5/06* (2006.01)
*H10B 12/00* (2023.01)

(52) U.S. Cl.
CPC ............. *G11C 5/063* (2013.01); *H10B 12/30* (2023.02); *H10B 12/488* (2023.02)

(58) Field of Classification Search
CPC .. G11C 5/063; G11C 7/02; G11C 8/14; H10B 12/30; H10B 12/488; H10B 12/05; H10B 12/482
See application file for complete search history.

(56) References Cited

U.S. PATENT DOCUMENTS

| | | | |
|---|---|---|---|
| 7,592,649 B2 | 9/2009 | Chung | |
| 8,742,493 B2 | 6/2014 | Kim | |
| 8,816,432 B2 | 8/2014 | Kim | |
| 10,170,570 B1 * | 1/2019 | Sonehara | ............... H10B 43/35 |
| 10,861,854 B2 | 12/2020 | Kim | |
| 2009/0166872 A1 | 7/2009 | Chung | |
| 2012/0119286 A1 | 5/2012 | Kim | |
| 2013/0099305 A1 | 4/2013 | Kim | |
| 2016/0351573 A1 * | 12/2016 | Yoshino | ............... H10B 12/315 |
| 2021/0125989 A1 | 4/2021 | Shin et al. | |

FOREIGN PATENT DOCUMENTS

| | | |
|---|---|---|
| CN | 112750829 A | 5/2021 |
| CN | 112837723 A | 5/2021 |

* cited by examiner

*Primary Examiner* — Mohammed R Alam
(74) *Attorney, Agent, or Firm* — Syncoda LLC; Feng Ma

(57) ABSTRACT

A semiconductor structure includes a substrate and a plurality of word lines located on a top surface of the substrate. Each of the word lines extends in a direction perpendicular to the top surface of the substrate. The plurality of word lines are arranged at intervals along a first direction. Any two adjacent ones of the word lines are arranged in an at least partially staggered manner along the first direction. The first direction is a direction parallel to the top surface of the substrate.

14 Claims, 7 Drawing Sheets

SEMICONDUCTOR STRUCTURE AND METHOD FOR FORMING SAME

CROSS-REFERENCE TO RELATED APPLICATIONS

The present application is a U.S. continuation application of International Application No. PCT/CN2022/102861 filed on Jun. 30, 2022, which claims priority to Chinese Patent Application No. 202210433936.8 filed on Apr. 24, 2022. The disclosures of the above-referenced applications are hereby incorporated by reference in their entirety.

BACKGROUND

Dynamic random access memory (DRAM) is a semiconductor device commonly used in electronic devices such as computers. It is composed of memory cells, and each of the memory cells usually includes a transistor and a capacitor. The gate of the transistor is electrically connected with a word line, the source is electrically connected with a bit line, and the drain is electrically connected with the capacitor. A word line voltage on the word line can control on and off of the transistor, so that data information stored in the capacitor can be read or written into the capacitor through the bit line.

In semiconductor structures such as DRAM, word lines are located at a same horizontal height, which leads to a strong capacitive coupling effect between adjacent word lines, thus affecting the electrical properties of semiconductor structures.

Therefore, how to reduce the capacitive coupling effect between the adjacent word lines and improve performance of semiconductor structures is an urgent technical problem to be solved.

SUMMARY

A semiconductor structure and a method for forming the same are provided by embodiments of the disclosure to solve the problem of strong capacitive coupling effect between adjacent word lines, so as to improve electrical properties of semiconductor structures.

Some embodiments of the disclosure provide a semiconductor structure. The semiconductor structure includes a substrate and a plurality of word lines located on a top surface of the substrate. Each of the word lines extends in a direction perpendicular to the top surface of the substrate, the plurality of word lines are arranged at intervals along a first direction, any two adjacent ones of the word lines are arranged in an at least partially staggered manner along the first direction, and the first direction is a direction parallel to the top surface of the substrate.

According to other embodiments, the present disclosure also provides a method for forming a semiconductor structure as described above, including the following operations.

A substrate is provided.

A plurality of word lines located on a top surface of the substrate are formed. Each of the word lines extends in a direction perpendicular to the top surface of the substrate. The plurality of word lines are arranged at intervals along a direction parallel to the top surface of the substrate. Along direction parallel to the top surface of the substrate, any two adjacent ones of the word lines are arranged in an at least partially staggered manner.

DETAILED DESCRIPTION

The disclosure relates to the technical field of manufacturing semiconductors, in particular to a semiconductor structure and a method for forming the same.

Semiconductor structures and methods for forming the same provided by specific embodiments of the present disclosure will be described in detail below in combination with the accompany drawings.

Figure 1:
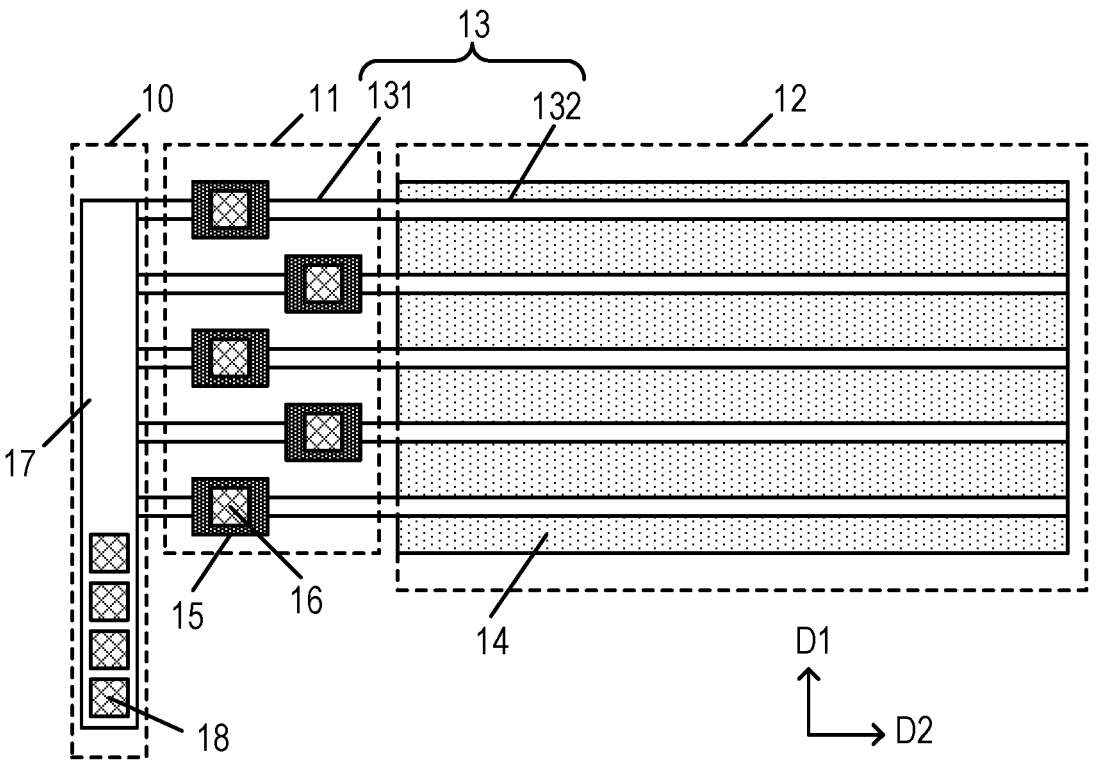
FIG. 1 is a top-view schematic diagram of a first semiconductor structure in embodiments of the disclosure.
Figure 2:
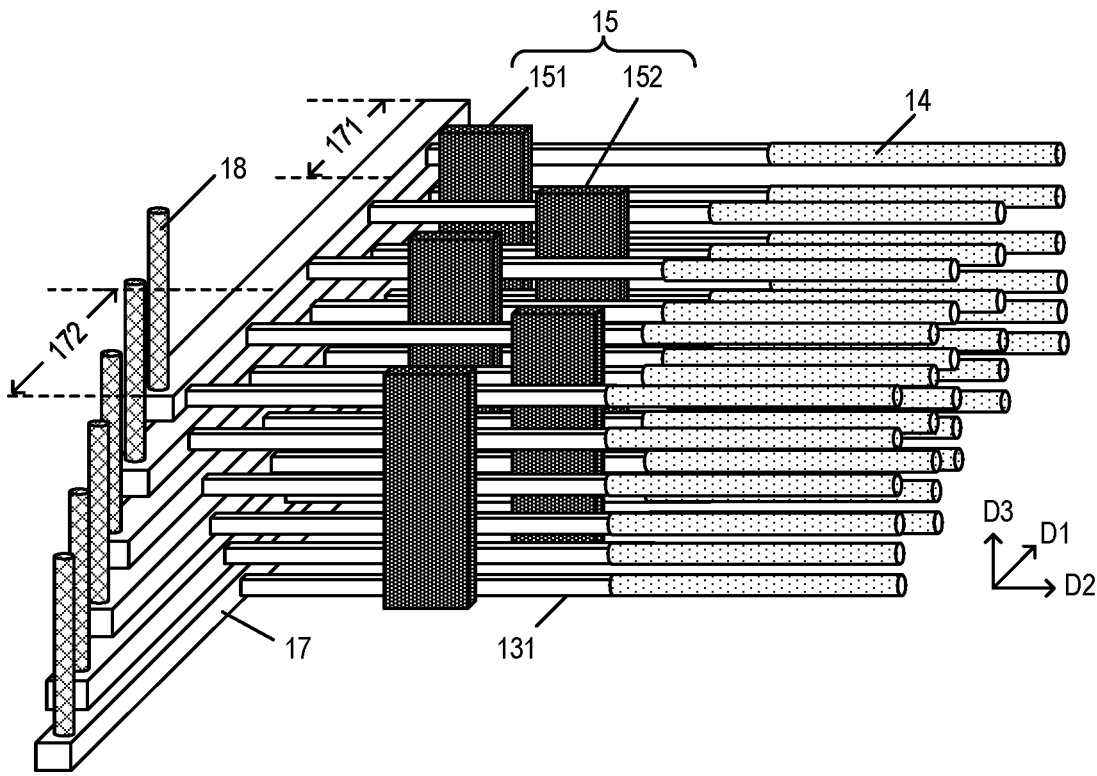
FIG. 2 is a perspective-view schematic diagram of the first semiconductor structure in embodiments of the disclosure.

This embodiment provides a semiconductor structure. FIG. 1 is a top-view schematic diagram of a first semiconductor structure in embodiments of the disclosure. FIG. 2 is a perspective-view schematic diagram of the first semiconductor structure in embodiments of the disclosure. The semiconductor structure described in the embodiment may be DRAM, but is not limited to. As shown in FIGS. 1 and 2, the semiconductor structure includes a substrate and a plurality of word lines 15 located on a top surface of the substrate.

Each of the word lines 15 extends in a direction D3 perpendicular to the top surface of the substrate. The plurality of word lines 15 are arranged at intervals along a first direction D1. Any two adjacent ones of the word lines 15 are arranged in an at least partially staggered manner along the first direction D1. The first direction is a direction parallel to the top surface of the substrate.

Specifically, the substrate may be, but is not limited to, a silicon substrate. The present embodiment is illustrated by taking a silicon substrate as an example. In other embodiments, the substrate may also be a semiconductor substrate, such as gallium nitride, gallium arsenide, gallium carbide, silicon carbide or SOI. The substrate is used for supporting a device structure on the substrate. The word lines 15 may be made of a conductive material, such as tungsten or TiN.

Specifically, as shown in FIGS. 1 and 2, each of the word lines 15 extends in the direction D3 perpendicular to the top surface of the substrate, to form vertical word line structures. The plurality of the word lines 15 are arranged at intervals along the first direction D1. Taking a first word line 151 and a second word line 152 adjacent to each other as an example, along the first direction D1, the first word line 151 and second word line 152 adjacent to each other are at least partially staggered. That is, a projection of the first word line 151 on a plane formed jointly by the second direction D2 and the direction D3 perpendicular to the top surface of the substrate is arranged in an at least partially staggered manner from a projection of the second word line 152 on the plane formed jointly by the second direction D2 and the direction D3 perpendicular to the top surface of the substrate. Therefore, an opposite area of the first word line 151 and the second word line 152 in the first direction D1 is reduced, thereby reducing the capacitive coupling effect between the first word line 151 and the second word line 152. Both the first direction D1 and the second direction D2 are directions parallel to the top surface of the substrate, and the first direction D1 is orthogonal to the second direction D2. In addition, in the embodiment, the capacitive coupling effect between the word lines is reduced by arranging the adjacent word lines in a staggered manner. Therefore, there is no need to increase a distance between the first word line 151 and the second word line 152 along the first direction D1, and there is no need to increase the dimension of the semiconductor structure, which is helpful for the semiconductor structure to further improve an integration level of the semiconductor structure.

In some embodiments, any two adjacent ones of the word lines 15 are arranged in a completely staggered manner along the first direction D1.

Take the plurality of the word lines 15 arranged at intervals along the first direction D1 as an example, arranging any two adjacent ones of the word lines 15 in a completely staggered manner means that projections of any two adjacent ones of the word lines 15 along the first direction D1 on a plane formed jointly by the second direction D2 and the direction D3 perpendicular to the top surface of the substrate are separated from each other (that is, the projections do not overlap each other). By arranging the two adjacent word lines 15 in a completely staggered manner, the capacitive coupling effect between the two adjacent word lines 15 can be sufficiently eliminated, thereby better improving the performance of the semiconductor structure.

In some embodiments, widths of any two adjacent ones of the word lines 15 in the second direction D2 are equal, so as to simplify the formation process of the word lines in the semiconductor structure and also simplify the word line drive operation of the semiconductor structure by making resistances of the plurality of the word lines 15 equal.

In some embodiments, along the direction D3 parallel to the top surface of the substrate, a gap width between projections of any two adjacent ones of the word lines 15 on the plane formed jointly by the second direction D2 and the direction D3 perpendicular to the top surface of the substrate is ¼ to ½ of the width of the word lines 15.

For example, the first word line 151 and the second word line 152 adjacent to each other are arranged in a completely staggered manner. The gap width between the projection of the first word line 151 in the plane formed jointly by the second direction D2 and the direction D3 perpendicular to the top surface of the substrate and the projection of the second word line 152 in the plane formed jointly by the second direction D2 and the direction D3 perpendicular to the top surface of the substrate is ¼ to ½ of the width of the first word line 151 in the second direction D2, so that the capacitive coupling effect between the first word line 151 and the second word line adjacent to each other 152 is eliminated without increasing the dimension of the semiconductor structure.

The present embodiment illustrates an example in which any two adjacent ones of the word lines 15 are arranged in a completely staggered manner along a direction parallel to the top surface of the substrate. In other embodiments, any two adjacent ones of the word lines 15 may also be arranged in a partially staggered manner along the direction parallel to the top surface of the substrate, thereby contributing to further reducing the dimension of the semiconductor structure while reducing the capacitive coupling effect between the adjacent word lines.

In an embodiment, projections of any two adjacent ones of the word lines 15 partially overlap on the plane formed jointly by the first direction D1 and the direction D3 perpendicular to the top surface of the substrate.

For example, for the first word line 151 and the second word line 152 adjacent to each other along the first direction D1, the projection of the first word line 151 on the plane formed by the first direction D1 and the direction D3 perpendicular to the top surface of the substrate partially overlaps the projection of the second word line 152 on the plane formed by the first direction D1 and the direction D3 perpendicular to the top surface of the substrate, thereby helping to reduce a distance between the first word line 151 and the second word line 152 along the first direction D1 and further improving a memory density of the semiconductor structure.

In some embodiments, along a direction parallel to the top surface of the substrate, the plurality of word lines 15 are sequentially ordered. Projections of any two adjacent ones of the odd-numbered word lines 15 overlap on the plane formed jointly by the second direction D2 and the direction D3 perpendicular to the top surface of the substrate. Projections of any two adjacent ones of the even-numbered word lines 15 overlap on the plane formed jointly by the second direction D2 and the direction D3 perpendicular to the top surface of the substrate. The second direction D2 is parallel to the top surface of the substrate, and the first direction D1 is orthogonal to the second direction D2.

Specifically, as shown in FIGS. 1 and 2, along the first direction D1, the plurality of word lines are sequentially ordered. That is, in the first direction D1, the odd-numbered word lines 15 (e.g. the first word lines 151) are alternately arranged with the even-numbered word lines 15 (e.g. the second word lines 152). Any odd-numbered word line 15 and the even-numbered word line 15 that are adjacent are arranged in an at least partially staggered manner along the first direction D1. Projections of any two adjacent ones of the odd-numbered word lines 15 overlap on the plane formed jointly by the second direction D2 and the direction D3 perpendicular to the top surface of the substrate, which means projections of any two adjacent ones of the odd-numbered word lines 15 are aligned along the first direction D1. Projections of any two adjacent ones of the even-numbered word lines 15 overlap on the plane formed jointly by the second direction D2 and the direction D3 perpendicular to the top surface of the substrate, which means projections of any two adjacent ones of the even-numbered word lines 15 are aligned along the first direction D1. By providing the odd-numbered and even-numbered word lines, setting the projections of any two adjacent ones of the odd-numbered word lines 15 overlapped on the plane formed jointly by the second direction D2 and the direction D3 perpendicular to the top surface of the substrate, and setting the projections of any two adjacent ones of the even-numbered word lines 15 overlapped on the plane formed jointly by the second direction D2 and the direction D3 perpendicular to the top surface of the substrate, the number of masks can be reduced, thereby simplifying the manufacturing process of the semiconductor structure and reducing the manufacturing cost of the semiconductor structure.

In order to further improve the integration degree of the semiconductor structure, in some embodiments, along the first direction D1, the plurality of word lines 15 are sequentially ordered, projections of any two adjacent ones of the 3n-th word lines 15 overlap on the plane formed jointly by the second direction D2 and the direction D3 perpendicular to the top surface of the substrate, projections of any two adjacent ones of the (3n+1)-th word lines 15 overlap on the plane formed jointly by the second direction D2 and the direction D3 perpendicular to the top surface of the substrate, and projections of any two adjacent ones of the (3n+2)-th word lines overlap on the plane formed jointly by the second direction D2 and the direction D3 perpendicular to the top surface of the substrate. Herein n is an integer, and the second direction is parallel to the top surface of the substrate, and the first direction is orthogonal to the second direction.

In some embodiments, the semiconductor structure further includes a plurality of semiconductor layers, a plurality of bit lines and a plurality of bit line leads.

The plurality of semiconductor layers are located above the top surface of the substrate. Each of the semiconductor layers includes a plurality of active pillars 131 arranged at intervals along the first direction D1. The plurality of semiconductor layers are arranged at intervals in the direction D3 perpendicular to the top surface of the substrate. Each of the active pillars includes a channel region, as wells as a drain region and a source region distributed at opposite sides of the channel region in the second direction D2. Each of the word lines 15 continuously covers a plurality of channel regions arranged at intervals in the direction perpendicular to the top surface of the substrate. The second direction D2 is parallel to the top surface of the substrate, and the first direction D1 is orthogonal to the second direction D2.

The plurality of bit lines 17 are located above the top surface of the substrate. Each of the bit lines 17 extends along the first direction D1. The plurality of bit lines 17 are arranged at intervals along the direction D3 perpendicular to the top surface of the substrate. Each of the bit lines 17 electrically connects all of the source regions in the corresponding semiconductor layer.

The plurality of bit line leads 18 are located above the top surface of the substrate. Each of the bit line leads 18 extends in the direction D3 perpendicular to the top surface of the substrate, and the plurality of bit line leads 18 are electrically connected with the plurality of bit lines 17, respectively.

In some embodiments, each of the bit lines 17 includes a first end 171 and a second end 172 opposite to the first end 171 along the first direction D1. For any two adjacent ones of the bit lines 17, the first end 171 of one bit line 17 closer to the substrate protrudes from the first end 171 of the other bit line 17 along the first direction D1.

The plurality of bit line leads 18 are electrically connected with the first ends 171 of the plurality of bit lines 17, respectively.

Specifically, a material of the semiconductor layer may be, but is not limited to, silicon. As shown in FIGS. 1 and 2, a transistor region 11, and a bit line region 10 and a capacitor region 12 distributed at opposite sides of the transistor region 11 along the second direction D2 are included above the top surface of the substrate. The plurality of semiconductor layers are arranged at intervals along the direction D3 perpendicular to the top surface of the substrate. Each of the semiconductor layers includes a plurality of semiconductor pillars 13 arranged at intervals along the first direction D1. Each of the semiconductor pillars 13 includes an active pillar 131 located in the transistor region 11 and a conductive pillar 132 located in the capacitor region 12. Each of the active pillars 131 includes a channel region, as well as a drain region and a source region located at opposite sides of the channel region along the second direction D2. The drain region is contacted with/electrically connected with the corresponding conductive pillar 132, and the drain region has the same doping ion as the conductive pillar 132 to further reduce a contact resistance between the drain region and the conductive pillar 132. The capacitor region 12 further includes a plurality of capacitors 14 distributed around the conductive pillars 132. Each of the capacitors 14 includes a lower electrode layer covering a surface of the corresponding conductive pillar 132, a dielectric layer covering a surface of the lower electrode layer, and an upper electrode layer covering a surface of the dielectric layer. The plurality of bit lines 17 are all located in the bit line region. The plurality of bit lines 17 are arranged at intervals along the direction D3 perpendicular to the top surface of the substrate. Each of the bit lines 17 electrically connects all source regions in the corresponding semiconductor layer.

Each of the bit lines 17 extends along the first direction D1. For any two adjacent ones of the bit lines 17, the first end 171 of one bit line 17 closer to the substrate protrudes from the first end 171 of the other bit line 17 along the first direction D1. By doing so, the first ends 171 of the plurality of bit lines 17 form a staircase structure. The plurality of bit line leads 18 are electrically connected to the first ends 171 of the plurality of bit lines 17 respectively, so as to lead out signals of all the bit lines 17 on a same side, thereby helping to reduce an occupied area of the bit line leads 18 and improve a space utilization rate inside the semiconductor structure.

Figure 3:
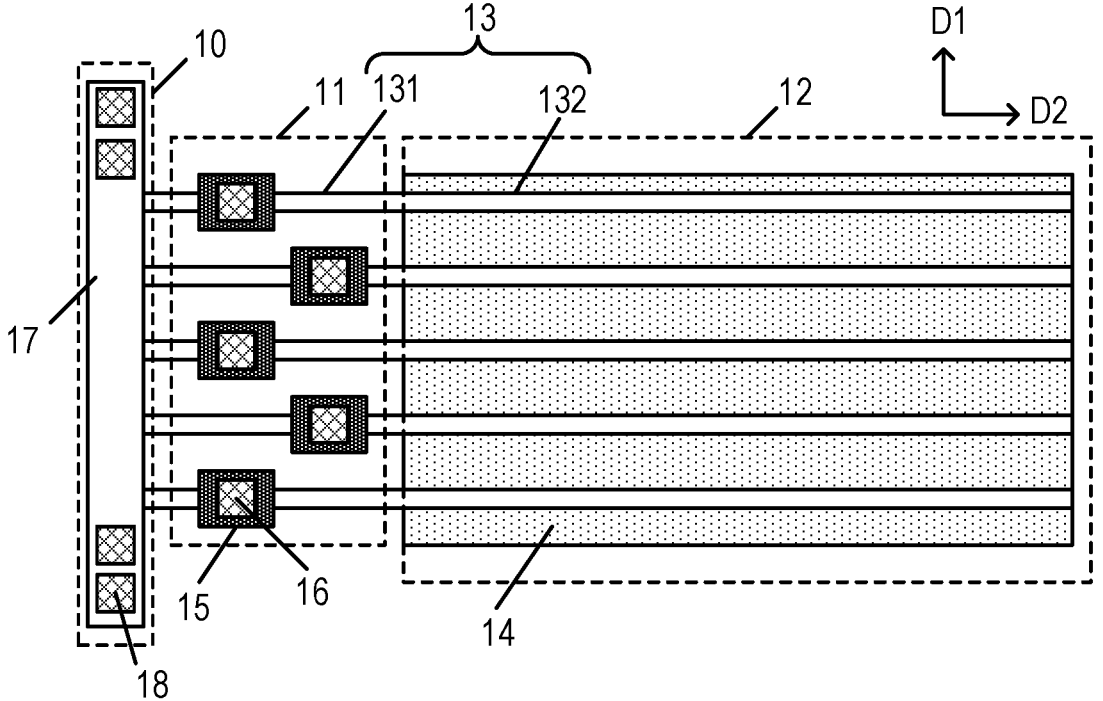
FIG. 3 is a top-view schematic diagram of a second semiconductor structure in embodiments of the disclosure.
Figure 4:
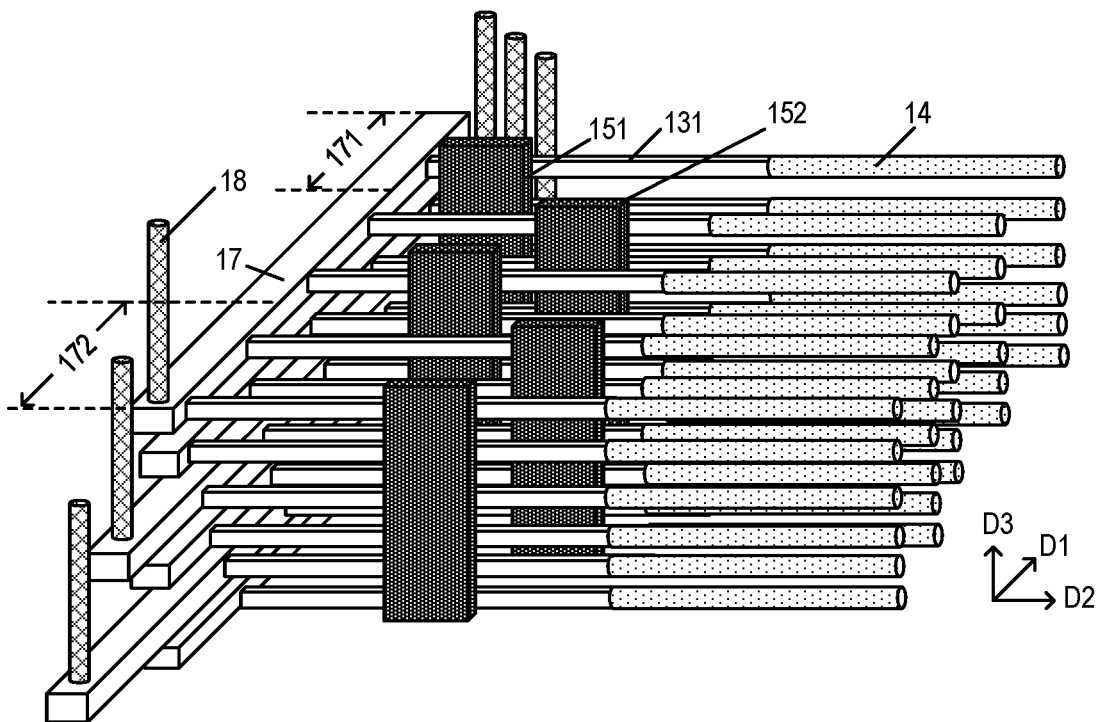
FIG. 4 is a perspective-view schematic diagram of the second semiconductor structure in embodiments of the disclosure.

FIG. 3 is a top-view schematic diagram of a second semiconductor structure in embodiments of the disclosure. FIG. 4 is a perspective-view schematic diagram of the second semiconductor structure in embodiments of the disclosure. In some other embodiments, as shown in FIGS. 3 and 4, each of the bit lines 17 includes a first end 171 and a second end 172 opposite to the first end 171 along the first direction D1.

For any two adjacent ones of the bit lines 17 in a direction D3 perpendicular to the top surface of the substrate, the bit line lead 18 electrically connected to one of the bit lines 17 is located at the first end 171 of the one of the bit lines 17, and the bit line lead 18 electrically connected to the other bit line 17 is located at the second end 172 of the other bit line 17.

In some other embodiments, the plurality of bit lines 17 are sequentially ordered along the direction D3 perpendicular to the top surface of the substrate, the bit line leads 18 electrically connected with the odd-numbered bit lines 17 are all located at the first ends 171 of the odd-numbered bit lines 17, and the bit line leads 18 electrically connected with the even-numbered bit line 17 are all located at the second ends 172 of the even-numbered bit lines 17.

Specifically, as shown in FIGS. 3 and 4, the bit line leads 18 electrically connected with the odd-numbered bit lines 17 are all located at the first ends 171 of the odd-numbered bit lines 17, and the bit line leads 18 electrically connected with the even-numbered bit line 17 are all located at the second ends 172 of the even-numbered bit lines 17. That is, two bit line leads 18 connected to any two adjacent bit lines 17 are distributed at opposite ends of the bit line region 10. As a result, a distance between the two adjacent bit line leads 18 is increased, a capacitive coupling effect between the adjacent bit line leads 18 is reduced, electrical performance of the semiconductor structure is further improved, a process window when the bit line leads 18 are formed can be increased, and the manufacturing difficulty of the semiconductor structure can be reduced.

In some embodiments, each of the bit lines 17 includes a first end face and a second end face opposite to the first end face along the first direction D1.

All the first end faces of the bit lines 17 arranged at intervals in the direction D3 perpendicular to the top face of the substrate are flush, and all the second end faces of the bit lines 17 are flush.

Specifically, bit line leads 18 electrically connected with the odd-numbered bit lines 17 are all located at the first ends 171 of the odd-numbered bit lines 17, and bit line leads 18 electrically connected with the even-numbered bit line 17 are all located at the second ends 172 of the even-numbered bit lines 17. For this reason, the first end faces of the plurality of bit lines 17 can all be aligned, and the second end faces of the plurality of bit lines 17 can all be aligned, so that the plurality of bit lines 17 do not need to form a staircase structure, and the manufacturing process of the semiconductor structure is thus simplified. Since a bit line lead 18 electrically connected to a bit line 17 in a lower layer needs to penetrate a bit line 17 in an upper layer, a sidewall of the bit line lead 18 further needs to be covered with an isolation layer, in order to isolate the sidewall of the bit line lead 18 from the bit line 17 in the upper layer.

In some embodiments, the plurality of bit lines 17 are sequentially ordered along the direction D3 perpendicular to the top surface of the substrate. For any two adjacent ones of the odd-numbered bit lines 17, the first end 171 of one bit line 17 closer to the substrate protrudes from the first end 171 of the other bit line 17 along the first direction D1.

For any two adjacent ones of the even-numbered bit lines 17, the second end 172 of one bit line 17 closer to the substrate protrudes from the second end of the other bit line 17 along the first direction D1.

Specifically, the first ends 171 of the plurality of odd-numbered bit lines 17 together form a staircase structure. The second ends 172 of the plurality of even-numbered bit lines 17 also form a staircase structure. Therefore, a bit line lead 18 connected to a bit line 17 in a lower layer does not need to penetrate a bit line 17 of a upper layer, so as to simplify the process for forming the bit line lead 18.

Figure 5:
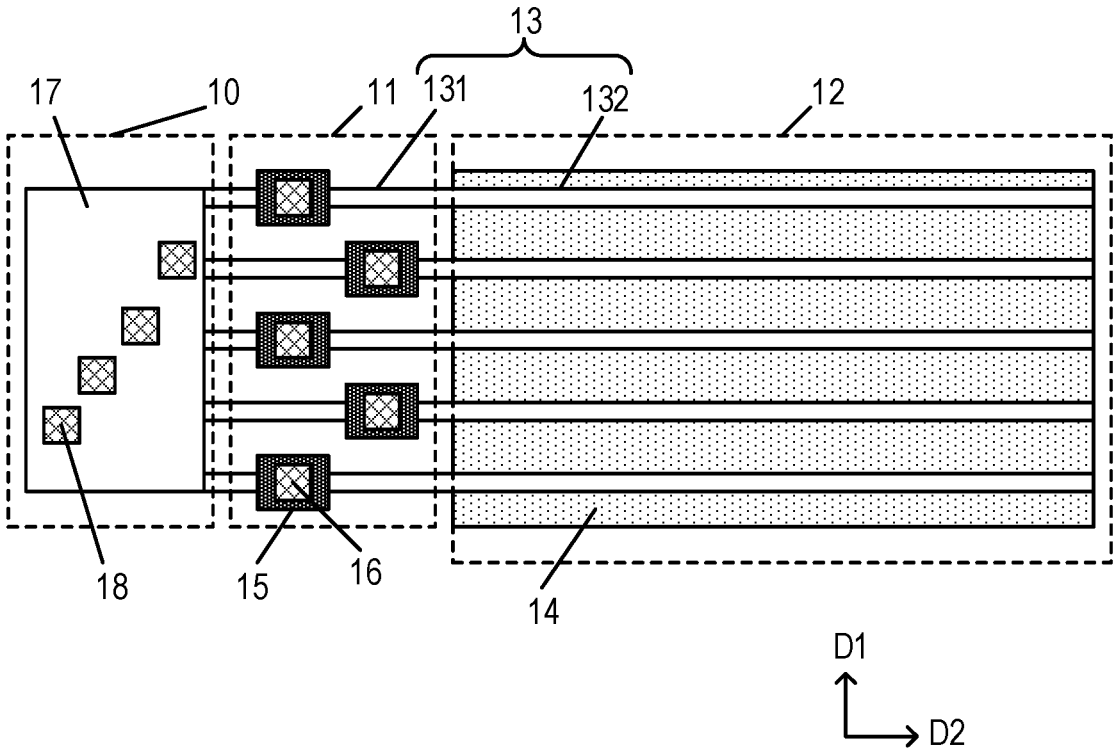
FIG. 5 is a top-view schematic diagram of a third semiconductor structure in embodiments of the disclosure.
Figure 6:
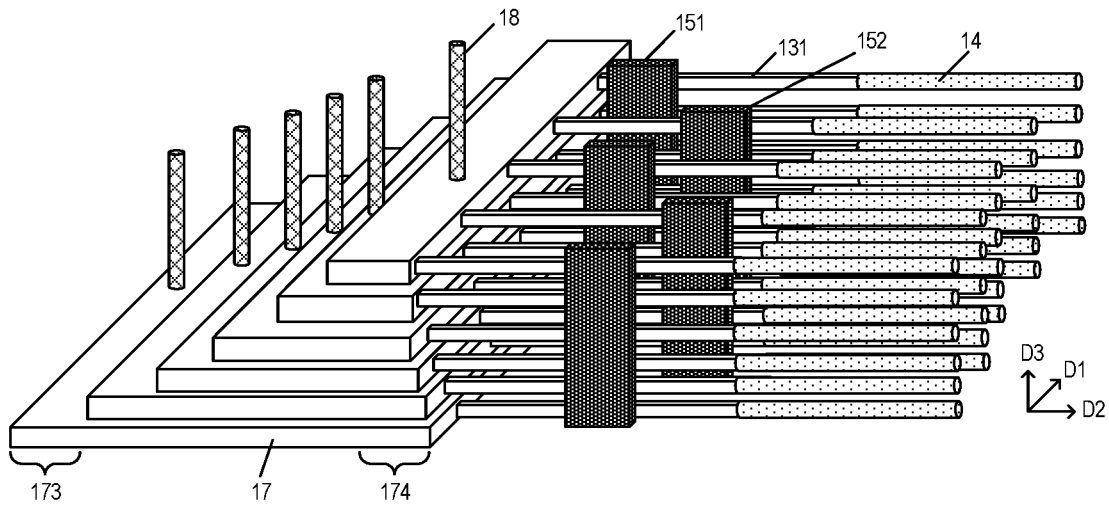
FIG. 6 is a perspective-view schematic diagram of the third semiconductor structure in embodiments of the disclosure.

FIG. 5 is a top-view schematic diagram of a third semiconductor structure in embodiments of the disclosure. FIG. 6 is a perspective-view schematic diagram of the third semiconductor structure in embodiments of the disclosure. In some other embodiments, as shown in FIGS. 5 and 6, each of the bit lines 17 extends along the first direction D1. Each of the bit lines 17 includes a third end 173 and a fourth end 174 opposite to the third end 173 along the second direction D2. For any two adjacent ones of the bit lines 17, the third end 173 of one bit line 17 closer to the substrate protrudes from the third end 173 of the other bit line 17 along the second direction D2.

The plurality of bit line leads 18 are electrically connected with the third ends 173 of the plurality of bit lines 17, respectively.

Specifically, as shown in FIGS. 5 and 6, each of the bit lines 17 extends along the first direction D1. Each of the bit lines 17 includes a third end 173 and a fourth end 174 opposite to the third end 173 along the second direction D2. The fourth end 174 of each of the bit lines 17 is electrically connected to all of the source regions in the corresponding semiconductor layer. The third ends 173 of the plurality of bit lines form a staircase structure, so that the plurality of bit line leads 18 are electrically connected with the third ends 173 of the plurality of bit lines 17, respectively.

In some embodiments, each of the word lines 15 includes a fifth end and a sixth end opposite to the fifth end along the second direction D2, and the semiconductor structure further includes a plurality of word line leads.

The plurality of word line leads 16 are located above the top surface of the substrate. Each of the word line leads 16 extends in the direction D3 perpendicular to the top surface of the substrate. The plurality of word line leads 16 are electrically connected with the plurality of the word lines 15, respectively.

For any two adjacent ones of the word lines 15 along the first direction, the word line lead 16 electrically connected with one of the word lines 15 is located at the fifth end of the one of the word lines 15, and the word line lead 16 electrically connected with the other word line 15 is located at the sixth end of the other word line 15.

Specifically, the word line leads 16 are used for transmitting external control signals to the word lines 15. Each of the word lines 15 includes a fifth end and a sixth end which are oppositely distributed along the second direction D2. Two word line leads 16 respectively connected to two adjacent ones of the word lines 15 are distributed at opposite ends, thereby increasing a distance between the two adjacent word line leads 16, helping to reduce a capacitive coupling effect between the plurality of word line leads 16, and further improving electrical properties of the semiconductor structure.

In another embodiment, the plurality of word line leads 16 are electrically connected to the fifth ends of the plurality of word lines 15 respectively, so as to lead out signals of all the word lines 15 on a same side, thereby helping to reduce an occupied area of the word line leads 16 and improve a space utilization rate inside the semiconductor structure.

Figure 7:
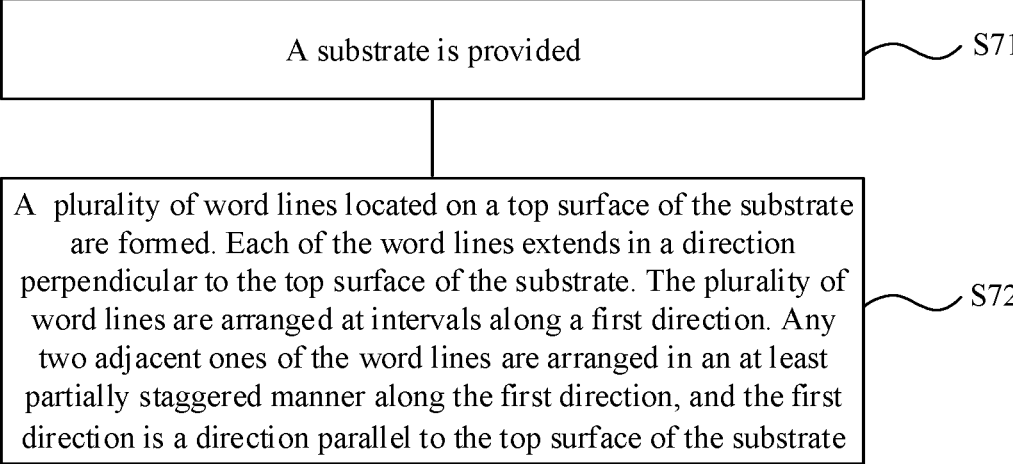
FIG. 7 is a flowchart of a method for forming a semiconductor structure in embodiments of the disclosure.

The embodiments also provide a method for forming any one of semiconductor structures as described above. FIG. 7 is a flowchart of a method for forming a semiconductor structure in embodiments of the disclosure. Schematic diagrams of the semiconductor structure formed in the embodiment can be seen in FIGS. 1-6. As shown in FIGS. 1-7, the method for forming the semiconductor structure includes the following operations.

In S71, a substrate is provided.

In S72, a plurality of word lines 15 are formed on a top surface of the substrate. Each of the word lines 15 extends in a direction D3 perpendicular to the top surface of the substrate. The plurality of word lines 15 are arranged at intervals along a first direction D1. Any two adjacent ones of the word lines 15 are arranged in an at least partially staggered manner along the first direction D1, and the first direction is a direction parallel to the top surface of the substrate.

In the semiconductor structures and methods for forming the same provided by the embodiments of the present disclosure, each of the word lines extends in a direction perpendicular to the top surface of the substrate. Along the first direction parallel to the top surface of the substrate, any two adjacent ones of the word lines are arranged in an at least partially staggered manner, so that an opposite area between the adjacent two word lines can be reduced, thereby reducing the capacitive coupling effect between the adjacent two word lines and realizing the improvement of the electrical performance of the semiconductor structure. In addition, the present disclosure reduces the capacitive coupling effect by reducing the opposite area between two adjacent word lines without increasing a distance between the adjacent two word lines in the direction parallel to the top surface of the substrate, thereby helping to control a dimension of the semiconductor structure.

The above are only the preferred embodiments of the disclosure, and it should be noted that for those skilled in the art, without departing from the principles of the disclosure, several modifications and improvements may be made, which also fall within the scope of protection of the disclosures.

What is claimed is:

1. A semiconductor structure comprising:
a substrate;
a plurality of word lines located on a top surface of the substrate, wherein each of the word lines extends in a direction perpendicular to the top surface of the substrate, the plurality of word lines are arranged at intervals along a first direction, any two adjacent ones of the word lines are arranged in an at least partially staggered manner along the first direction, and the first direction is a direction parallel to the top surface of the substrate; and
a plurality of semiconductor layers located above the top surface of the substrate, wherein each of the semiconductor layers comprises a plurality of active pillars arranged at intervals along the first direction, and the plurality of semiconductor layers are arranged at intervals in the direction perpendicular to the top surface of the substrate, each of the active pillars comprises a channel region, as wells as a drain region and a source region distributed at opposite sides of the channel region in a second direction, each of the word lines continuously covers a plurality of channel regions arranged at intervals in the direction perpendicular to the top surface of the substrate, the second direction is parallel to the top surface of the substrate, and the first direction is orthogonal to the second direction.

2. The semiconductor structure of claim 1, wherein any two adjacent ones of the word lines are arranged in a completely staggered manner along the first direction.

3. The semiconductor structure of claim 2, wherein projections of any two adjacent ones of the word lines partially overlap on a plane formed jointly by the first direction and the direction perpendicular to the top surface of the substrate.

4. The semiconductor structure of claim 1, wherein in the first direction, the plurality of word lines are sequentially ordered, projections of any two adjacent ones of odd-numbered word lines overlap on a plane formed jointly by a second direction and the direction perpendicular to the top surface of the substrate, projections of any two adjacent ones of even-numbered word lines overlap on the plane formed jointly by the second direction and the direction perpendicular to the top surface of the substrate, the second direction is parallel to the top surface of the substrate, and the first direction is orthogonal to the second direction.

5. The semiconductor structure of claim 1, wherein in the first direction, the plurality of word lines are sequentially ordered, projections of any two adjacent ones of 3n-th word lines overlap on a plane formed jointly by a second direction and the direction perpendicular to the top surface of the substrate, projections of any two adjacent ones of (3n+1)-th word lines overlap on the plane formed jointly by the second direction and the direction perpendicular to the top surface of the substrate, projections of any two adjacent ones of (3n+2)-th word lines overlap on the plane formed jointly by the second direction and the direction perpendicular to the top surface of the substrate, and wherein n is an integer, and the second direction is parallel to the top surface of the substrate, and the first direction is orthogonal to the second direction.

6. The semiconductor structure of claim 1, further comprising:
a plurality of bit lines located above the top surface of the substrate, wherein each of the bit lines extends along the first direction, and the plurality of bit lines arranged at intervals along the direction perpendicular to the top surface of the substrate; and
a plurality of bit line leads located above the top surface of the substrate, wherein each of the bit line leads extends in the direction perpendicular to the top surface of the substrate, and the plurality of bit line leads are electrically connected with the plurality of bit lines, respectively.

7. The semiconductor structure of claim 6, wherein each of the bit lines comprises a first end and a second end opposite to the first end along the first direction, and for any two adjacent ones of the bit lines, the first end of one bit line closer to the substrate protrudes from the first end of an other bit line along the first direction; and
wherein the plurality of bit line leads are electrically connected with first ends of the plurality of bit lines, respectively.

8. The semiconductor structure of claim 6, wherein each of the bit lines comprises a first end and a second end opposite to the first end along the first direction; and
wherein for any two adjacent ones of the bit lines in the direction perpendicular to the top surface of the substrate, a bit line lead electrically connected to one of the bit lines is located at the first end of the one of the bit lines, and the bit line lead electrically connected to an other bit line is located at the second end of the other bit line.

9. The semiconductor structure of claim 8, wherein the plurality of bit lines are sequentially ordered along the direction perpendicular to the top surface of the substrate, the bit line leads electrically connected with odd-numbered bit lines are all located at the first ends of odd-numbered bit lines, and the bit line leads electrically connected with even-numbered bit lines are all located at the second ends of the even-numbered bit lines.

10. The semiconductor structure of claim 9, wherein each of the bit lines comprises a first end face and a second end face opposite to the first end face along the first direction; and
wherein first end faces of the bit lines arranged at intervals in the direction perpendicular to the top face of the substrate are flush, and second end faces of the bit lines are flush.

11. The semiconductor structure of claim 9, wherein the plurality of bit lines are sequentially ordered along the direction perpendicular to the top surface of the substrate, and for any two adjacent ones of the odd-numbered bit lines, the first end of one bit line closer to the substrate protrudes from the first end of an other bit line along the first direction; and
wherein for any two adjacent ones of the even-numbered bit lines, the second end of one bit line closer to the substrate protrudes from the second end of an other bit line along the first direction.

12. The semiconductor structure of claim 6, wherein each of the bit lines comprises a third end and a fourth end opposite to the third end along the second direction, and for any two adjacent ones of the bit lines, the third end of one bit line closer to the substrate protrudes from the third end of an other bit line along the second direction; and wherein the plurality of bit line leads are electrically connected with the third ends of the plurality of bit lines, respectively.

13. The semiconductor structure of claim 6, wherein widths of any two adjacent ones of the word lines are equal along the second direction.

14. The semiconductor structure of claim 6, wherein each of the word lines comprises a fifth end and a sixth end opposite to the fifth end along the second direction, and the semiconductor structure further comprises:

a plurality of word line leads located above the top surface of the substrate, wherein each of the word line leads extends in the direction perpendicular to the top surface of the substrate, and the plurality of word line leads are electrically connected with the plurality of word lines, respectively, wherein for any two adjacent ones of the word lines along the first direction, a word line lead electrically connected with one of the word lines is located at the fifth end of the one of the word lines, and the word line lead electrically connected with an other word line is located at the sixth end of the other word line.

\*    \*    \*    \*    \*